United States Patent
Haydin et al.

(10) Patent No.: US 9,646,745 B2
(45) Date of Patent: May 9, 2017

(54) THERMISTOR ASSEMBLY INCLUDING ELASTOMERIC BODY

(71) Applicant: FORD GLOBAL TECHNOLOGIES, LLC, Dearborn, MI (US)

(72) Inventors: Vedat Haydin, Canton, MI (US); Deborah E. Callicoat, Livonia, MI (US); Francisco Fernandez, Canton, MI (US); Brian Utley, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 18 days.

(21) Appl. No.: 14/445,362

(22) Filed: Jul. 29, 2014

(65) Prior Publication Data
US 2016/0035467 A1  Feb. 4, 2016

(51) Int. Cl.
| H01C 7/00 | (2006.01) |
| H01M 10/48 | (2006.01) |
| G01R 31/36 | (2006.01) |
| H01C 1/02 | (2006.01) |

(52) U.S. Cl.
CPC ......... *H01C 7/008* (2013.01); *G01R 31/3606* (2013.01); *G01R 31/3658* (2013.01); *H01C 1/02* (2013.01); *H01M 10/482* (2013.01); *H01M 10/486* (2013.01); *H01M 2200/10* (2013.01); *H01M 2200/106* (2013.01); *H01M 2220/20* (2013.01)

(58) Field of Classification Search
None
See application file for complete search history.

(56) References Cited

U.S. PATENT DOCUMENTS

| 4,483,341 | A | * | 11/1984 | Witteles | A61F 7/00 606/21 |
| 4,873,507 | A |  | 10/1989 | Antonas |  |
| 4,881,057 | A | * | 11/1989 | Garcia | G01K 15/00 338/28 |
| 5,043,692 | A |  | 8/1991 | Sites et al. |  |
| 7,815,368 | B2 |  | 10/2010 | Sasaki et al. |  |
| 8,206,032 | B2 |  | 6/2012 | Wakabayashi |  |
| 8,363,425 | B2 |  | 1/2013 | Rupert et al. |  |
| 2005/0207473 | A1 | * | 9/2005 | Philip | F25D 29/005 374/185 |
| 2012/0111591 | A1 | * | 5/2012 | Shelton, IV | A61B 17/00234 173/46 |
| 2012/0249079 | A1 | * | 10/2012 | Bennett | B60K 6/28 320/136 |

FOREIGN PATENT DOCUMENTS

| CN | 101233396 B | 12/2010 |
| CN | 102339975 A | 2/2012 |
| CN | 102611150 A | 7/2012 |

* cited by examiner

*Primary Examiner* — Patrick Ryan
*Assistant Examiner* — Zhongqing Wei
(74) *Attorney, Agent, or Firm* — Carlson, Gaskey & Olds

(57) ABSTRACT

A thermistor assembly according to an exemplary aspect of the present disclosure includes, among other things, an elastomeric body, a thermistor housed at least partially inside the elastomeric body and a thermistor tip that protrudes outside of the elastomeric body.

18 Claims, 8 Drawing Sheets

US 9,646,745 B2

1

THERMISTOR ASSEMBLY INCLUDING ELASTOMERIC BODY

TECHNICAL FIELD

This disclosure relates to a thermistor assembly. The thermistor assembly may be employed within a battery assembly of an electrified vehicle.

BACKGROUND

The need to reduce fuel consumption and emissions in automobiles and other vehicles is well known. Therefore, vehicles are being developed that reduce or completely eliminate reliance on internal combustion engines. Electrified vehicles are one type of vehicle currently being developed for this purpose. In general, electrified vehicles differ from conventional motor vehicles in that they are selectively driven by one or more battery powered electric machines. Conventional motor vehicles, by contrast, rely exclusively on the internal combustion engine to drive the vehicle.

Electrified vehicle battery assemblies may be equipped with one or more battery arrays that include a plurality of battery cells. The battery cells must be reliably connected to one another in order to achieve the necessary voltage and power levels for operating the electrified vehicle. Numerous parts, including but not limited to bus bars, sense-line wiring, and sensors, are typically required to electrically connect the battery cells.

SUMMARY

A thermistor assembly according to an exemplary aspect of the present disclosure includes, among other things, an elastomeric body, a thermistor housed at least partially inside the elastomeric body and a thermistor tip that protrudes outside of the elastomeric body.

In a further non-limiting embodiment of the foregoing assembly, a housing at least partially encapsulates the elastomeric body.

In a further non-limiting embodiment of either of the foregoing assemblies, the elastomeric body is molded into the housing.

In a further non-limiting embodiment of any of the foregoing assemblies, the housing is made of a material having a first modulus of elasticity and the elastomeric body is made of a material having a second modulus of elasticity that is different from the first modulus of elasticity.

In a further non-limiting embodiment of any of the foregoing assemblies, the elastomeric body is made of an ethylene propylene diene monomer (EPDM).

In a further non-limiting embodiment of any of the foregoing assemblies, the elastomeric body is made of silicone.

In a further non-limiting embodiment of any of the foregoing assemblies, sense-line wiring extends from the elastomeric body.

In a further non-limiting embodiment of any of the foregoing assemblies, the elastomeric body is generally T-shaped.

In a further non-limiting embodiment of any of the foregoing assemblies, the elastomeric body extends between a proximal portion and a distal portion, at least one flange protruding outwardly from the elastomeric body between the proximal portion and the distal portion.

2

In a further non-limiting embodiment of any of the foregoing assemblies, the distal portion includes laterally protruding legs.

A battery assembly according to another exemplary aspect of the present disclosure includes, among other things, a battery array including a plurality of battery cells and a bus bar module mounted to the battery array. At least one thermistor assembly is mounted to the bus bar module and includes an elastomeric body and a thermistor housed inside the elastomeric body. The thermistor includes a thermistor tip that protrudes from the elastomeric body and contacts at least one of the plurality of battery cells.

In a further non-limiting embodiment of the foregoing assembly, a housing at least partially encapsulates the elastomeric body.

In a further non-limiting embodiment of either of the foregoing assemblies, the housing includes a leg portion and a winged portion that extends from the leg portion.

In a further non-limiting embodiment of any of the foregoing assemblies, the winged portion includes a nose and wings that extend laterally from the winged portion.

In a further non-limiting embodiment of any of the foregoing assemblies, the elastomeric body is made of rubber or silicone.

A battery assembly according to another exemplary aspect of the present disclosure includes, among other things, a plurality of battery cells and a bus bar module positioned over the plurality of battery cells. A thermistor assembly is mounted to the bus bar module. The thermistor assembly includes an elastomeric body that is compressible between a first position and a second position to accommodate cell height variations between a first battery cell and a second battery cell of the plurality of battery cells.

In a further non-limiting embodiment of the foregoing assembly, a housing at least partially surrounds the elastomeric body.

In a further non-limiting embodiment of either of the foregoing assemblies, a thermistor is housed inside the elastomeric body.

In a further non-limiting embodiment of any of the foregoing assemblies, the thermistor includes a thermistor tip that extends outside of the elastomeric body and contacts the first battery cell or the second battery cell.

In a further non-limiting embodiment of any of the foregoing assemblies, a metallic bar is received within a central groove of the bus bar module.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure details a thermistor assembly for use within a battery assembly of an electrified vehicle. The thermistor assembly may include an elastomeric body and a thermistor housed at least partially inside the elastomeric body. The thermistor assembly includes a thermistor tip that may protrude outside of the elastomeric body. In some embodiments, a housing at least partially surrounds or encapsulates the elastomeric body. The thermistor assembly may be mounted to a bus bar module of the battery assembly using a variety of mounting arrangements. These and other features are discussed in greater detail in the paragraphs that follows.

Figure 1:
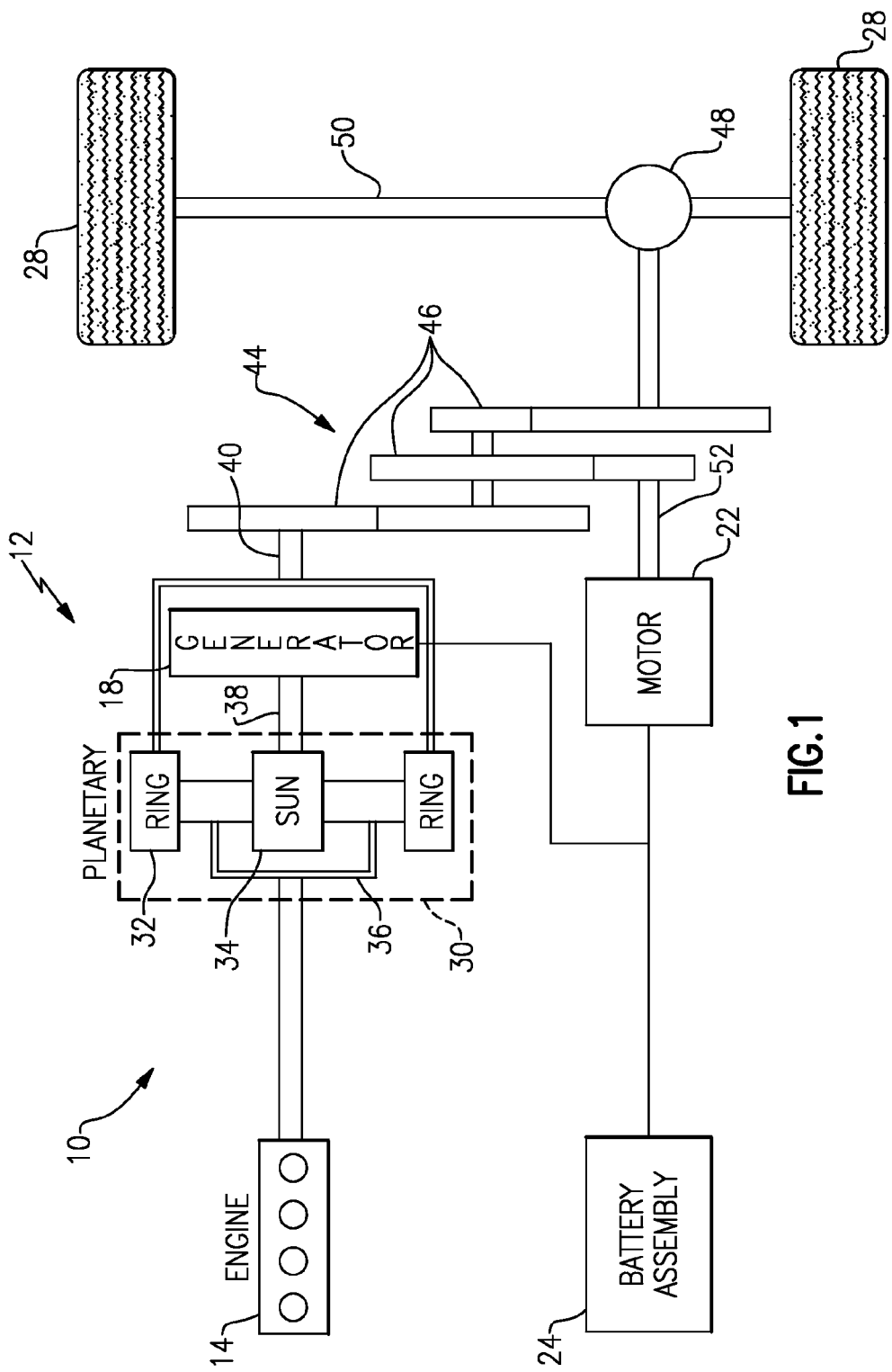
FIG. 1 schematically illustrates a powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEV's and could extend to other electrified vehicles, including, but not limited to, plug-in hybrid electric vehicles (PHEV's) and battery electric vehicles (BEV's).

In one embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery assembly 24. In this example, the second drive system is considered an electric drive system of the powertrain 10. The first and second drive systems generate torque to drive one or more sets of vehicle drive wheels 28 of the electrified vehicle 12. Although a power-split configuration is shown, this disclosure extends to any hybrid or electric vehicle including full hybrids, parallel hybrids, series hybrids, mild hybrids or micro hybrids.

The engine 14, which could include an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery assembly 24.

The battery assembly 24 is an example type of electrified vehicle battery assembly. The battery assembly 24 may include a high voltage battery pack that includes a plurality of battery arrays capable of outputting electrical power to operate the motor 22 and the generator 18. Other types of energy storage devices and/or output devices can also be used to electrically power the electrified vehicle 12.

In one non-limiting embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery assembly 24 state of charge up to its maximum allowable discharging rate under certain driving patterns/cycles. The EV mode is an example of a charge depleting mode of operation for the electrified vehicle 12. During EV mode, the state of charge of the battery assembly 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery assembly 24 at a constant or approximately constant level by increasing the engine 14 propulsion usage. The electrified vehicle 12 may be operated in other operating modes in addition to the EV and HEV modes within the scope of this disclosure.

Figure 2:
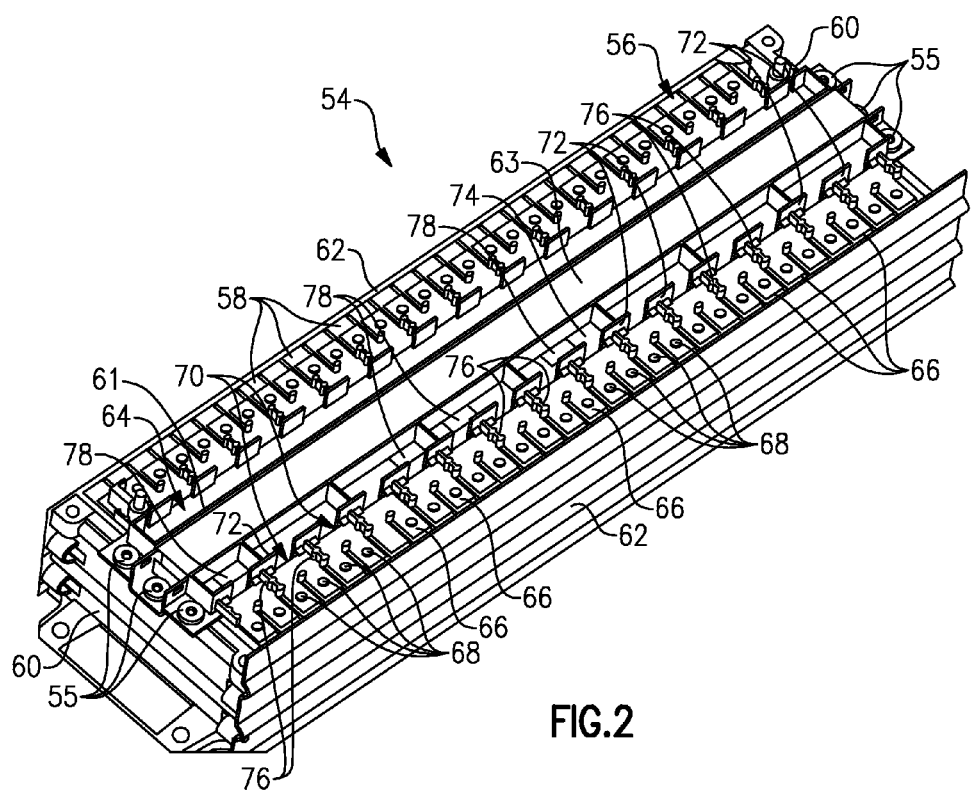
FIG. 2 illustrates a battery assembly of an electrified vehicle.

FIG. 2 illustrates a battery assembly 54 that can be incorporated into an electrified vehicle. For example, the battery assembly 54 could be employed within the electrified vehicle 12 of FIG. 1. The battery assembly 24 can include one or more battery arrays 56 for supplying electrical power to components of an electrified vehicle. Although a single battery array 56 is illustrated in FIG. 2, the battery assembly 54 could include multiple battery arrays 56 within the scope of this disclosure. In other words, this disclosure is not limited to the specific configuration shown in FIG. 2.

The battery array 56 includes a plurality of battery cells 58 stacked side-by-side and extending between opposing end plates 60 and side plates 62 to build the battery array 56. In one embodiment, the battery cells 58 are prismatic, lithium-ion cells. However, other battery cells, including cylindrical or pouch cells, could alternatively be utilized.

A bus bar module 64 may be positioned over the battery array 56. In one embodiment, the bus bar module 64 rests on top of the battery cells 58. A bar 63 may retain the bus bar module 64 to the end plates 60 of the battery array 56, such as by using one or more fasteners 55. In one embodiment, the bar 63 is a metallic bar that is received within a central groove 61 of the bus bar module 64.

The bus bar module 64 may accommodate a plurality of bus bars 66 that are positioned to electrically connect the battery cells 58 of the battery array 56. The bus bars 66 may connect the battery cells 58 in either a series string or a parallel string.

The bus bars 66 may be connected to terminals 68 that extend from the battery cells 58. Each bus bar 66 electrically connects adjacent terminals 68 of adjacent battery cells 58. In one embodiment, the bus bars 66 connect adjacent terminals 68 that have opposite polarities (i.e., negative to positive or positive to negative). The bus bars 66 may be stamped, relatively thin strips of metal that are configured to conduct power generated by the battery cells 58. Example bus bar materials include copper, brass or aluminum, although other materials having conductive properties may also be suitable. In one embodiment, the bus bars 66 are high current bus bars having relatively high amperage capacities.

The bus bars 66 may be mounted within pockets 70 of the bus bar module 64. The pockets 70 may extend between walls 72 that protrude from a top surface 74 of the bus bar module 64. The bus bars 66 may be separated from one another by arms 76 that extend from the walls 72. In one embodiment, the bus bars 66 are welded to the bus bar module 64 using an ultrasonic welding operation that is suitable for welding dissimilar materials.

Figure 3:
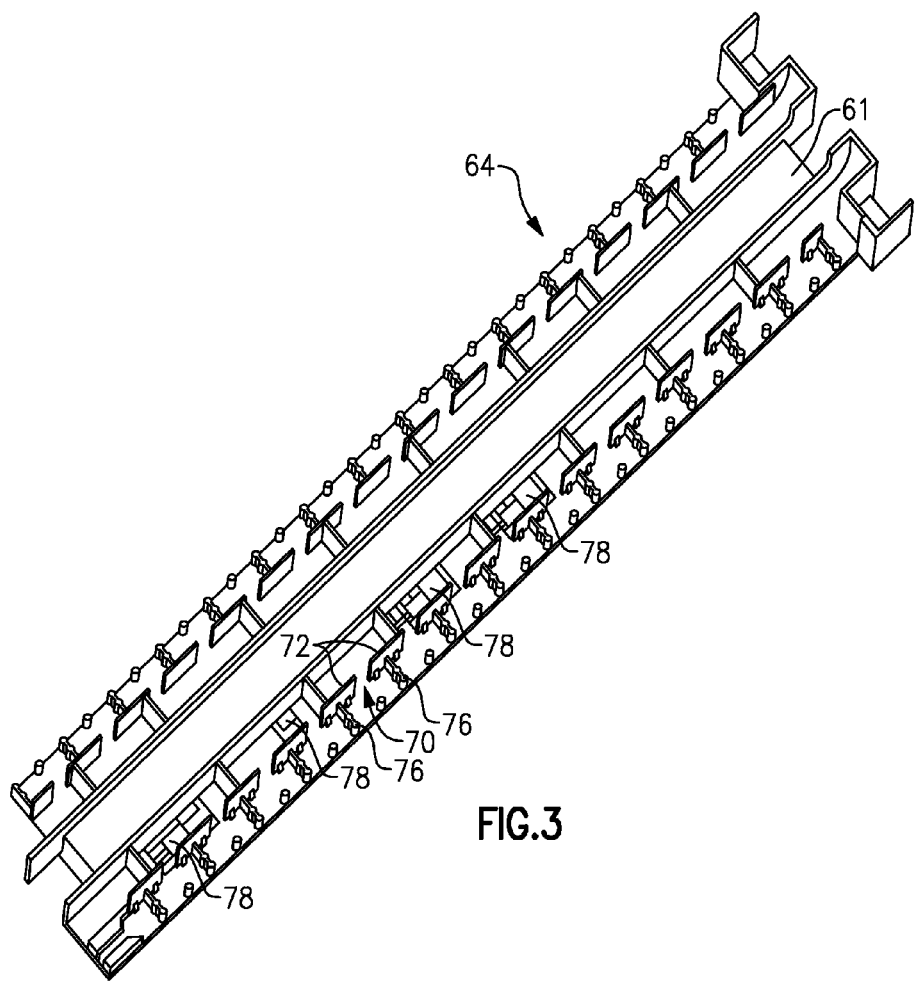
FIG. 3 illustrates a bus bar module of a battery assembly.

Referring to FIGS. 2 and 3, one or more thermistor assemblies 78 may also be mounted to the bus bar module 64. Exemplary mounting arrangements are discussed in greater detail below, and the mounting locations shown in FIGS. 2 and 3 are not intended to limit this disclosure. The battery array 56 and bus bars 66 are removed in FIG. 3 for clarity.

The thermistor assemblies 78 may monitor battery conditions, such as temperatures, of one or more battery cells 58 of the battery array 56. In one embodiment, the thermistor assemblies 78 are thermal resistors that exhibit changes in resistance in response to temperature changes of the battery cells 58. Information pertaining to any changes in resistance responsive to changes in temperature is communicated to and processed by a control module (not shown), such as a battery electronic control module (BECM), to monitor the functionality of the battery assembly 54, such as to avoid overcharging the battery cells 58.

FIGS. 4A, 4B, 4C and 4D illustrate an exemplary thermistor assembly 78. In one non-limiting embodiment, the thermistor assembly 78 includes a housing 80, an elastomeric body 82 and a thermistor 84 housed inside the elastomeric body 82 (see FIGS. 4C and 4D). The housing 80 may partially surround the elastomeric body 82. Other thermistor assemblies are contemplated that eliminate the housing 80 (see, e.g., the thermistor assembly 178 of FIGS. 8A, 8B and 8C).

In this embodiment, the housing 80 acts as an outer shell of the thermistor assembly 78 and may be constructed of a plastic material. Non-limiting examples of suitable plastic materials include polypropylene and nylon. The housing 80 may extend along a longitudinal axis A (see FIG. 4A) and includes a leg portion 86 and a winged portion 88. The winged portion 88 may be slightly elevated relative to the leg portion on a top 90 of the housing 80. The winged portion 88 may include wings 92 that extend laterally from the winged portion 88 in a direction transverse to the longitudinal axis A. In another embodiment, the winged portion 88 includes a platform 94 that protrudes from the winged portion 88 at a bottom 96 of the housing 80.

Figure 4A:
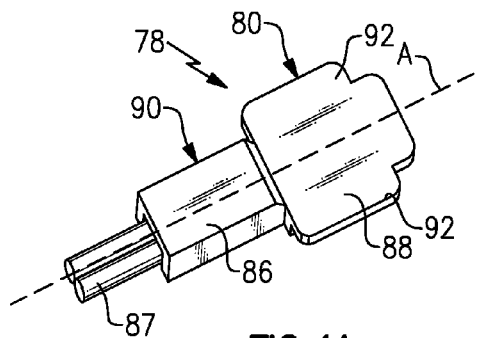
FIGS. 4A, 4B, 4C and 4D illustrate a thermistor assembly according to a first embodiment of this disclosure.
Figure 4D:
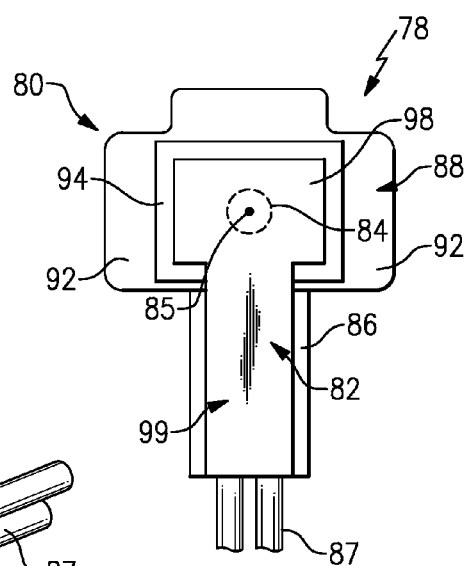
Figure 4B:
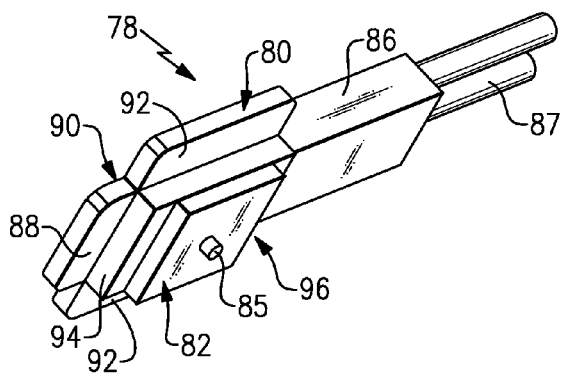
Figure 4C:
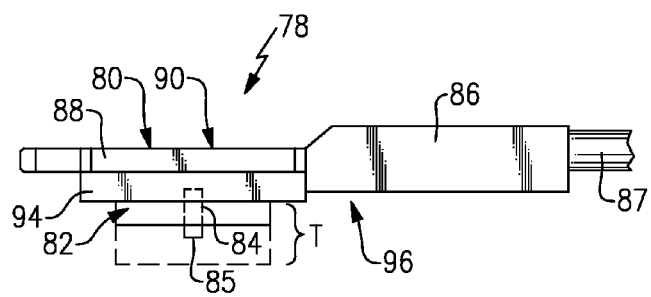

The elastomeric body 82 may be molded into the housing 80, and the housing 80 could entirely or only partially encapsulate the elastomeric body 82. In one embodiment, as best shown in FIG. 4D, the elastomeric body 82 includes a head portion 98 and a leg portion 99 that extends from the head portion 98. The head portion 98 and leg portion 99 may be configured in a T-shape, although other shapes and configurations are contemplated. The head portion 98 of the elastomeric body 82 may protrude out from the platform 94 of the winged portion 88 of the housing 80. The thickness T (see FIG. 4C) of the portion of the elastomeric body 82 that protrudes from the housing 80 can vary depending on design specific criteria. In another embodiment, the leg portion 99 extends within both the winged portion 88 and the leg portion 86 of the housing 80.

In one embodiment, the elastomeric body 82 is made of a material that includes a different modulus of elasticity than the material of the housing 80. Non-limiting examples of elastomeric materials suitable to construct the elastomeric body 82 include rubber, ethylene propylene diene monomer (EPDM) and silicone.

The thermistor 84 is housed within the elastomeric body 82. In one embodiment, the thermistor 84 includes a thermistor tip 85 that protrudes outside of the head portion 98 of the elastomeric body 82. The thermistor 84 may be connected to sense-line wiring 87. The sense-line wiring 87 is embedded within the housing 80 and/or the elastomeric body 82 and may extend outside of the thermistor assembly 78 to connect to a control module or some other component.

Figure 5A:
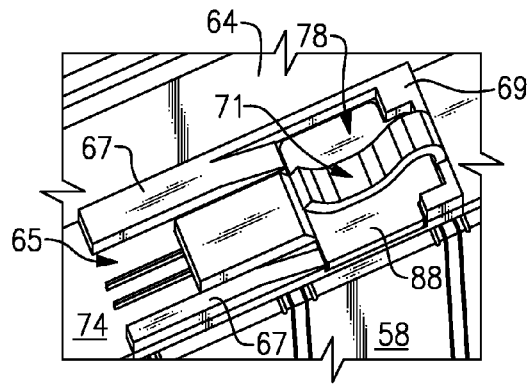
FIGS. 5A and 5B illustrate a mounting arrangement for the thermistor assembly of FIGS. 4A-4D.
Figure 5B:
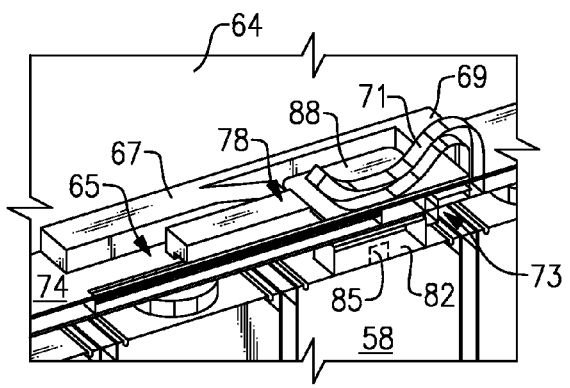

FIGS. 5A and 5B illustrate a first mounting arrangement of the thermistor assembly 78. The bus bar module 64 may include a mounting receptacle 65 for receiving the thermistor assembly 78. The mounting receptacle 65 may be disposed at a top surface 74 of the bus bar module 64 and may include side walls 67 that extend upwardly from the top surface 74. An end wall 69 connects between the side walls 67, which are spaced apart from one another and arranged in parallel.

In one embodiment, the thermistor assembly 78 is mounted within the mounting receptacle 65 with a spring clip 71. The spring clip 71 may extend from the end wall 69 and rest atop the winged portion 88 of the housing 80 of the thermistor assembly 78 after it is inserted into the mounting receptacle 65. The elastomeric body 82 of the thermistor assembly 78 extends through an opening 73 (best shown in FIG. 5B) of the mounting receptacle 65 and contacts a battery cell 58 for accurate monitoring of temperature conditions of the battery cell 58. The flexible, spring-like nature of the elastomeric body 82 provides consistent contact between the thermistor tip 85 and the battery cell 58 with a minimal amount of required force.

Figure 6A:
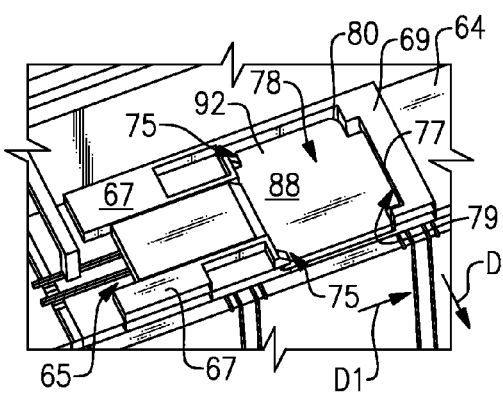
FIGS. 6A and 6B illustrate another mounting arrangement for the thermistor assembly of FIGS. 4A-4D.
Figure 6B:
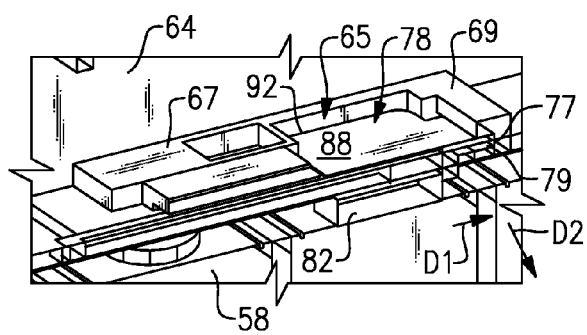

Another exemplary mounting arrangement is illustrated in FIGS. 6A and 6B. In this embodiment, the mounting receptacle 65 includes lock tabs 75 instead of the spring clip feature of FIGS. 5A and 5B. In one embodiment, the lock tabs 75 extend from opposing side walls 67 of the mounting receptacle 65 in a direction toward an end wall 69. The thermistor assembly 78 may be mounted to the bus bar module 64 by positioning a nose 77 of the winged portion 88 of the housing 80 within a slot 79 of the mounting receptacle 65 by moving the thermistor assembly 78 in a first direction D1. The slot 79 may extend under the wall 69.

Once the nose 77 is far enough into the slot 79 (i.e., under the wall 69), the thermistor assembly 78 may be moved in a second direction D2 that is transverse to the first direction D1 until the lock tabs 75 can be positioned over the wings 92 of the winged portion 88 of the housing 80. The slot 79 and the lock tabs 75 substantially retain the thermistor assembly 78 within the mounting receptacle 65 such that the elastomeric body 82 remains in consistent contact with the battery cell 58.

Figure 7:
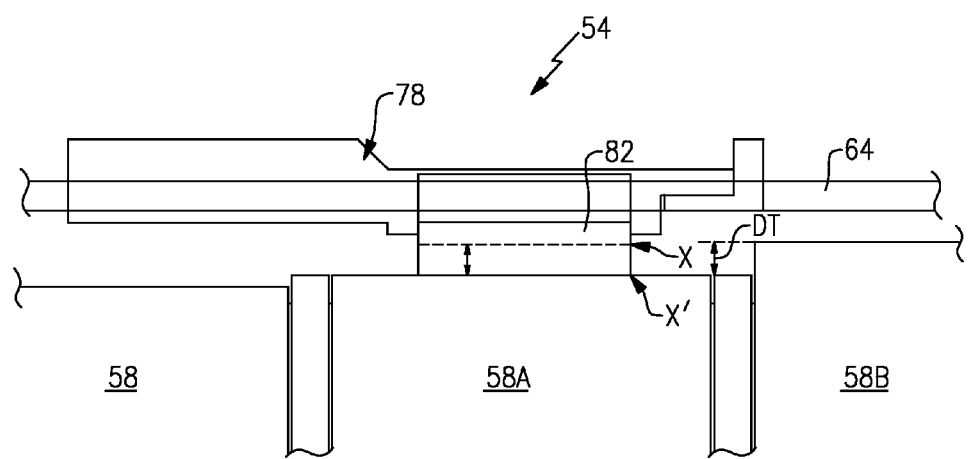
FIG. 7 schematically illustrates the use of a thermistor assembly to accommodate cell height variations of a battery assembly.

FIG. 7 illustrates a cross-sectional view through a battery assembly 54. As illustrated, a thermistor assembly 78 can accommodate dimensional variations between adjacent battery cells 58. For example, a first battery cell 58A may become displaced by a distance DT from a second battery cell 58B, causing height variations between the adjacent battery cells 58. In such situations, the elastomeric body 82 of the thermistor assembly 78 may expand between a first position X and a second position X' to accommodate cell height variations that may occur during assembly or operation of the battery assembly 54 in order to maintain consistent contact between the thermistor assembly 78 and the first battery cell 58A. In another embodiment, an opposite configuration is contemplated in which the elastomeric body 82 compresses between the second position X' and the first position X if the first battery cell 58A is displaced to a position that is above the height of the second battery cell 58B.

Figure 8A:
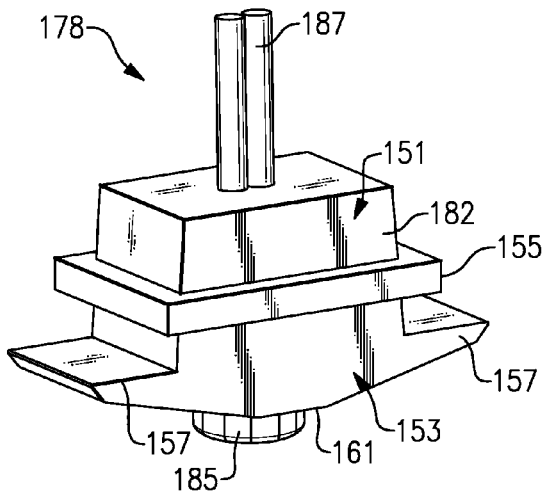
FIGS. 8A, 8B and 8C illustrate a thermistor assembly according to a second embodiment of this disclosure.
Figure 8B:
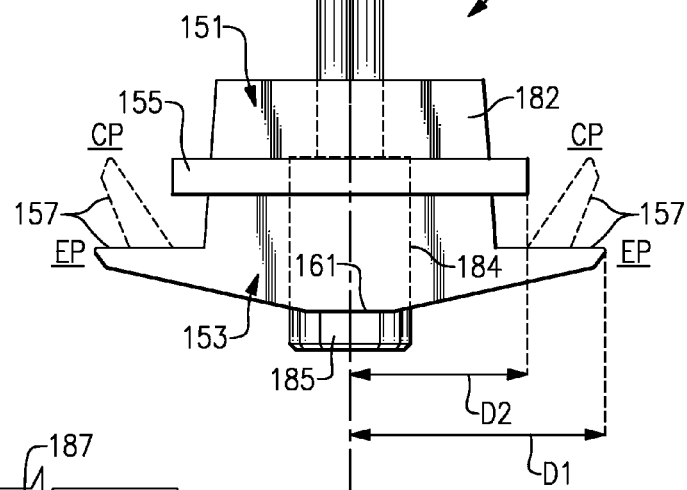
Figure 8C:
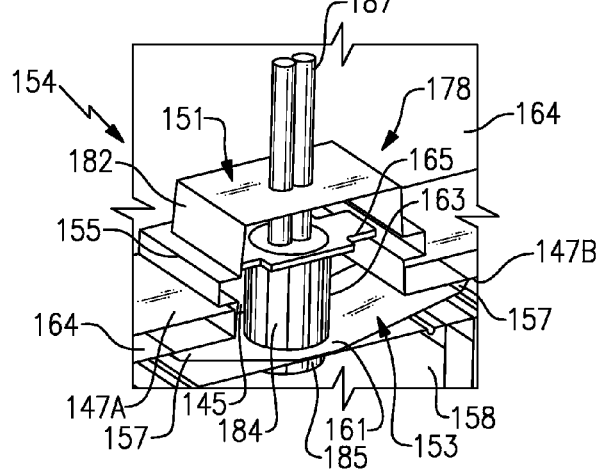

FIGS. 8A, 8B and 8C illustrate another exemplary thermistor assembly 178. In this disclosure, like reference numbers designate like elements where appropriate and reference numerals with the addition of 100 or multiples thereof designate modified elements that are understood to incorporate the same features and benefits of the corresponding original elements.

In this embodiment, the thermistor assembly 178 includes an elastomeric body 182 and a thermistor 184 housed inside the elastomeric body 182 (see FIGS. 8B and 8C). Unlike the thermistor assembly 78 described above, the thermistor assembly 178 excludes any housing that at least partially encapsulates the elastomeric body 182.

In one embodiment, the elastomeric body 182 extends along a longitudinal axis A (see FIG. 8B) between a proximal portion 151 and a distal portion 153. A flange 155 protrudes outwardly from the elastomeric body 182 at a location between the proximal portion 151 and the distal portion 153. In one embodiment, the flange 155 circumscribes the elastomeric body 182.

The distal portion 153 may include a pair of laterally extending legs 157. The legs 157 extend in opposite directions from one another in a direction away from the elastomeric body 182. In one embodiment, the legs 157 extend transverse to the longitudinal axis A. The legs 157 may be flexible between an expanded position EP and a compressed position CP (shown in phantom, see FIG. 8B).

In another embodiment, the legs 157 extend outwardly a distance D1 from the elastomeric body 182 as measured from the longitudinal axis A of the elastomeric body 182, and the flange 155 extends outwardly a distance D2. The distance D1 may be a greater distance than the distance D2 such that the legs 157 extend further away from the elastomeric body 182 than the flange 155.

The thermistor 184 may be substantially encapsulated inside the elastomeric body 182. In one embodiment, the elastomeric body 182 is overmolded around the thermistor 184. The thermistor 184 may include a thermistor tip 185 that protrudes from a nose 161 of the distal portion 153.

In another embodiment, as best illustrated in FIG. 8C, a can 163 surrounds the thermistor 184. A flange 165 of the can 163 may be mounted to the elastomeric body 182 to support the thermistor 184 inside of the elastomeric body 182. Sense-line wiring 187 may extend from the thermistor 184 to a location outside of the thermistor assembly 178.

An exemplary mounting arrangement of the thermistor assembly 178 is illustrated in FIG. 8C, with continued reference to FIGS. 8A and 8B. A bus bar module 164 of a battery assembly 154 may include a cut-out 145 for receiving the thermistor assembly 178. In one embodiment, the distal portion 153 of the thermistor assembly 178 may be positioned within the cut-out 145. As the distal portion 153 is moved further into the cut-out 145, the legs 157 flex between the expanded position EP and the compressed position CP shown in FIG. 8B. The legs 157 can pass through the cut-out 145 in the compressed position CP. The legs 157 extend under a surface 147-B of the bus bar module 164 and the flange 155 extends above a surface 147-A once the distal portion 153 has been inserted into the cut-out 145 to secure the thermistor assembly 178 to the bus bar module 164. The thermistor tip 185 contacts a battery cell 158 in the mounted position of the thermistor assembly 178.

Figure 9:
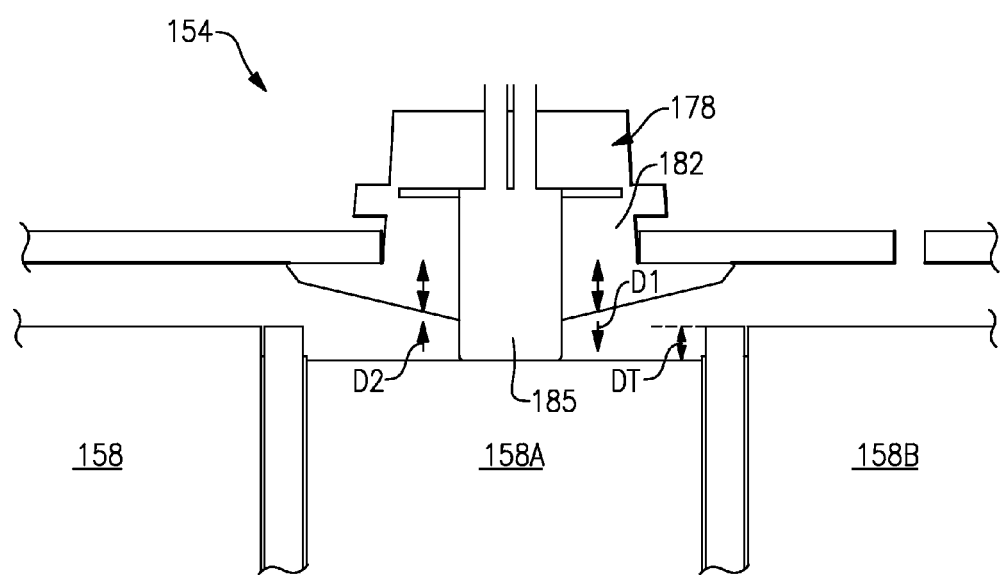
FIG. 9 illustrates the use of another thermistor assembly to accommodate cell height variations of a battery assembly.

FIG. 9 illustrates a cross-sectional view through a battery assembly 154. As illustrated, a thermistor assembly 178 can accommodate dimensional variations between adjacent battery cells 158 of the battery assembly 154. For example, a first battery cell 158A may become displaced by a distance DT from a second battery cell 158B, thereby causing height variations between the adjacent battery cells 158. In such situations, the elastomeric body 182 of the thermistor assembly 178 may expand by moving in a first direction D1, or compress by moving in a second direction D2, to accommodate cell height variations that may occur during assembly or operation of the battery assembly 154. In this way, the thermistor tip 185 may remain in contact with the battery cell 158A despite any cell height variations.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A thermistor assembly for use in a battery pack of an electrified vehicle, comprising:
    an elastomeric body;
    a thermistor housed at least partially inside said elastomeric body; and
    a thermistor tip that protrudes outside of said elastomeric body.

2. The assembly as recited in claim 1, comprising a housing that at least partially encapsulates said elastomeric body.

3. The assembly as recited in claim 2, wherein said elastomeric body is molded into said housing.

4. The assembly as recited in claim 2, wherein said housing is made of a material having a first modulus of elasticity and said elastomeric body is made of a material having a second modulus of elasticity that is different from said first modulus of elasticity.

5. The assembly as recited in claim 1, wherein said elastomeric body is made of an ethylene propylene diene monomer (EPDM).

6. The assembly as recited in claim 1, wherein said elastomeric body is made of silicone.

7. The assembly as recited in claim 1, comprising sense-line wiring that extends from said elastomeric body.

8. The assembly as recited in claim 1, wherein said elastomeric body is generally T-shaped.

9. The assembly as recited in claim 1, wherein said elastomeric body extends between a proximal portion and a distal portion, at least one flange protruding outwardly from said elastomeric body between said proximal portion and said distal portion.

10. The assembly as recited in claim 9, wherein said distal portion includes laterally protruding legs.

11. The assembly as recited in claim 2, wherein said housing extends along a longitudinal axis and includes a leg portion and a winged portion.

12. The assembly as recited in claim 11, wherein said winged portion includes multiple wings that protrude laterally from said winged portion in a direction transverse to said longitudinal axis.

13. The assembly as recited in claim 11, wherein said winged portion includes a platform that protrudes from a bottom of said housing.

14. The assembly as recited in claim 11, wherein said elastomeric body includes a head portion within said winged portion and a leg portion within said leg portion of said housing.

15. The assembly as recited in claim 14, wherein said head portion protrudes from a platform of said winged portion of said housing.

16. The assembly as recited in claim 10, wherein said laterally extending legs are configured to flex between an expanded position and a compressed position.

17. The assembly as recited in claim 10, wherein said laterally extending legs extend outwardly from said elastomeric body by a first distance and said at least one flange extends outwardly from said elastomeric body by a second distance, and said first distance is greater than said second distance.

18. The assembly as recited in claim 1, wherein said thermistor tip protrudes from a nose of a distal portion of said elastomeric body.

* * * * *

UNITED STATES PATENT AND TRADEMARK OFFICE
CERTIFICATE OF CORRECTION

PATENT NO. : 9,646,745 B2
APPLICATION NO. : 14/445362
DATED : May 9, 2017
INVENTOR(S) : Vedat Haydin et al.

It is certified that error appears in the above-identified patent and that said Letters Patent is hereby corrected as shown below:

In the Claims

In Claim 16, Column 10, Line 16; after "laterally" replace "extending" with --protruding--

In Claim 17, Column 10, Line 19; after "laterally" replace "extending" with --protruding--

Signed and Sealed this
Tenth Day of October, 2017

Joseph Matal
*Performing the Functions and Duties of the*
*Under Secretary of Commerce for Intellectual Property and*
*Director of the United States Patent and Trademark Office*